United States Patent [19]

Allen et al.

[11] Patent Number: 5,272,042

[45] Date of Patent: Dec. 21, 1993

[54] POSITIVE PHOTORESIST SYSTEM FOR NEAR-UV TO VISIBLE IMAGING

[75] Inventors: Robert D. Allen, San Jose, Calif.; William R. Brunsvold, Poughkeepsie, N.Y.; Burton J. Carpenter, Austin, Tex.; William D. Hinsberg, Fremont, Calif.; Joseph LaTorre; Michael G. McMaster, both of Austin, Tex.; Melvin W. Montgomery, New Windsor, N.Y.; Wayne M. Moreau, Wappinger, N.Y.; Logan L. Simpson, Binghampton, N.Y.; Robert J. Tweig, San Jose; Gregory M. Wallraff, Morgan Hill, both of Calif.

[73] Assignee: International Business Machines Corporation, Armonk, N.Y.

[21] Appl. No.: 761,183

[22] Filed: Sep. 17, 1991

Related U.S. Application Data

[63] Continuation-in-part of Ser. No. 322,848, Mar. 14, 1989, abandoned.

[51] Int. Cl.⁵ .................................................. G03C 1/73
[52] U.S. Cl. ....................................... 430/270; 430/326; 430/910; 430/920; 430/921; 430/925; 430/926

[58] Field of Search ................ 430/919, 920, 921, 926, 430/286, 914, 326, 270, 910, 925

[56] References Cited

U.S. PATENT DOCUMENTS

| | | | |
|---|---|---|---|
| 4,258,121 | 3/1924 | Kojima | 430/281 |
| 4,371,605 | 2/1983 | Renner | 430/280 |
| 4,425,424 | 1/1910 | Altland et al. | 430/270 |
| 4,491,628 | 1/1985 | Ito et al. | 430/176 |
| 4,618,564 | 10/1986 | Demmer et al. | 430/270 |
| 5,023,164 | 6/1991 | Burnsvold et al. | 430/270 |
| 5,055,439 | 10/1991 | Allen et al. | 502/158 |
| 5,077,174 | 12/1991 | Bauer et al. | 430/270 |
| 5,120,633 | 6/1992 | Bauer et al. | 430/176 |

*Primary Examiner*—Marion E. McCamish
*Assistant Examiner*—Rosemary Ashton
*Attorney, Agent, or Firm*—Richard M. Goldman

[57] ABSTRACT

Disclosed is a positive photoresist. The photoresist has as its polymeric component a substantially water and base insoluble, photolabile polymer. The photoresist further includes a photo acid generator that is capable of forming a strong acid. This photo acid generator may be a sulfonate ester derived from a N-hydroxyamide, or a N-hydroxyimide. Finally, the photoresist composition includes an appropriate photosensitizer.

3 Claims, No Drawings

POSITIVE PHOTORESIST SYSTEM FOR NEAR-UV TO VISIBLE IMAGING

CROSS REFERENCE TO RELATED APPLICATION

This is a Continuation-In-Part of our commonly assigned, co-pending U.S. application, Ser. No. 322,848 filed Mar. 14, 1989 for CHEMICALLY AMPLIFIED PHOTORESIST now abandoned.

FIELD OF THE INVENTION

This invention relates to metal ion free photoresists, and more particularly to highly sensitive positive photoresist systems for imaging in the near-ultraviolet to visible spectrum. The positive photoresist system is characterized by the combination of a (1) a photolabile polymer having recurrent pendant groups, such as t-butyl carbonate groups or t-butyl ester groups, such that prior to exposure the polymer is substantially insoluble in aqueous solutions, and after exposure is highly soluble in alkaline aqueous media, (2) an acid generator chosen from the group consisting of sulfonate esters derived from N-hydroxyamides and N-hydroxyimides, and capable of being photosensitized to form strong acids upon exposure to actinic radiation, and (3) a photosensitizer. The acid generator is free of metal ions and liberates sulfonate ions.

BACKGROUND OF THE INVENTION

The use of positive photoresists is generally well-known, and is described by Wayne M. Moreau in *Semiconductor Lithography: Principles, Practices, and Materials*, Plenum Press, New York, N.Y. (1988), especially in Chapter 2, "Positive Resists," at pages 29–80, which is incorporated herein by reference. The general structures and manufacturing processes for electronic packages, including the use of positive photoresists in the fabrication of electronic packages, are described in, for example, Donald P. Seraphim, Ronald Lasky, and Che-Yo Li, *Principles of Electronic Packaging*, McGraw-Hill Book Company, New York, N.Y., (1988), especially Chapter 12, "Lithography In Electronic Packaging," by Gerald W. Jones, Jane M. Shaw, and Donald E. Barr, at pages 372 to 379 thereof, and Rao R. Tummala and Eugene J. Rymaszewski, *Microelectronic Packaging Handbook*, Van Nostrand Reinhold, New York, N.Y. (1988), especially Chapter 12, "Printed Circuit Board Packaging" by Donald P. Seraphim, Donald E. Barr, William T. Chen, George P. Schmitt, and Rao R. Tummala, at pages 898 to 904 thereof, both of which are hereby incorporated herein by reference.

Positive photoresists are compositions that contain high molecular weight compounds that define a pattern for subsequent processing. In the case of integrated circuit chips, processing takes the form of metal evaporation, implantation, and silicon oxidation. In the case of printed circuit boards and ceramic packages the subsequent processing takes the forms of (1) selective addition of metals or other elements to the surface by plating, or (2) the subtraction of metals or other elements from the surface by one form or another of etching. The parent polymer of the resist protects the material underneath the resist pattern from these processing steps.

In photolithography, images are created in the photoresist by exposure to light through a mask, with subsequent developing to form a pattern of open (exposed) areas and closed (protected) areas. In this way the resist transforms the two dimensional circuit design on a mask into a three dimensional circuit feature. Where small features, for example on the order of 1 to 15 microns, are imaged, positive photoresists are especially preferred. Positive photomasks are mostly opaque and are less subject to particle defects. Additionally, the high contrast exhibited by positive resists makes them especially useful for laser direct write production of circuit boards. Positive photoresists are characterized by an increase in solubility upon exposure to light. This is contrary to negative resists which become less soluble upon exposure to actinic radiation.

Photoacids work by the photolytic formation of Lewis Acids and protonic acids. These photo generated acids catalyze the deprotection of the acid labile groups or degrade the main chain by acidolysis. The action of the acid may be one or both of main chain scission or side chain scission. The preferred photo acid generators have heretofore been onium salts, that is, salts of the type $ArN_2X$, $Ar_2IX$, and $Ar_3SX$, where Ar is an aryl group, and X is typically $BF_4-$, $PF_6-$, $AsF_6-$, and $SbF_6-$. The anions represented by X must be disposed of after development, and salts of the type $Ar_2IX$ exhibit incompatibility with copper and copper containing substrates. This precludes the use of $Ar_2IX$ salts in circuit board production. Thus, it is an object of the invention to overcome these shortcomings of the present technology, and avoid the use of $Ar_2IX$ and the formation of such anions as $BF_4-$, $PF_6-$, $AsF_6-$, and $SbF_6-$.

Photoacid generators and photoresist systems are described in U.S. Pat. No. 4,618,564 to Christopher G. Demmer and Edward G. Irving for *Process for Production of Positive Images Using Sulfonic Acid Precursors*. U.S. Pat. No. 4,371,605 to Carl A. Renner for *Photopolymerizable Compositions Containing N-Hydroxyamide and N-Hydroxyimide Sulfonates*, U.S. Pat. No. 4,258,121 to Teruo Kojima for *Photopolymerizable Compositions*, and U.S. Pat. No. 4,425,424, for *Dye-Forming Compositions*. These patents all show photoacid generators of the type

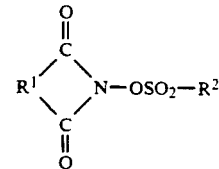

where $R^1$ may be an aryl group and $R^2$ may be an aryl or alkyl group.

U.S. Pat. No. 4,618,564 to Christopher G. Demmer and Edward G. Irving for *Process for Production of Positive Images Using Sulfonic Acid Precursors* describes a positive photoresist system where the dissolution of the positive resist composition is inhibited by the acid generator in an aqueous base. The acid generator, e.g., a sulfonic acid generator, forms an acid and thereby enhances the rate of solubilization of the polymer in areas exposed to actinic radiation. However, Demmer et al. do not use chemical amplification. As a consequence, Demmer et al. use amine containing photosensitizers, as crystal violet, which are not only incompatible with chemically amplified systems, but actually impair the photospeed thereof. Moreover, because the Demmer et al. system is not a chemically amplified system, actinic energy doses approaching 1 Joule/cm$^2$ are required to effect solubilization of the positive resist.

The other three patents all pertain to negative working resists, in which a monomer polymerizes or crosslinks with a matrix to form an insoluble film. U.S. Pat. No. 4,371,605 to Carl A. Renner for *Photopolymerizable Compositions Containing N-Hydroxyamide and N-Hydroxyimide Sulfonates*, U.S. Pat. No. 4,258,121 to Teruo Kojima for *Photopolymerizable Compositions*, and U.S. Pat. No. 4,425,424, for Dye-Forming Compositions, describe the use of this type of acid generator in acid catalyzed photopolymerization. These three patents all describe the use of toxic and/or flammable solvents to process, that is, to develop the image.

U.S. Pat. No. 4,491,628 to Hiroshi Ito, Carlton G. Willson, and Jean M. J. Frechet for *Positive- and Negative-Working Resist Compositions With Acid Generating Photoinitiator and Polymer With Acid Labile Groups Pendant From Polymer Backbone* describes a deep ultraviolet resist which works in the 240 to 300 nanometer region. The described resist systems are formulated from polymers having recurrent pendant groups, such as t-butyl esters or t-butyl carbonates, that undergo efficient acidolysis with concommitant changes in solubility when an onium salt, for example, azodiazonium salts, diaryliodonium salts, or triarylsulfonium salts, are exposed to actinic radiation, as ultraviolet, electron beam, or x-ray radiation. While most onium salts can not be efficiently sensitized to wavelengths longer than 435 nanometers, diaryliodonium salts can be efficiently sensitized to the longer wavelengths. However, an interaction between iodonium salts and copper precludes the use of iodonium salts for printed circuit boards.

OBJECTS OF THE INVENTION

It is a primary object of the invention to provide a high photospeed positive photoresist, especially one that has high photospeed in the visible to near ultraviolet portion of the spectrum.

It is a further primary object of the invention to provide a photo acid generator that can be photosensitized to high photospeeds at very long wavelengths, that is, to visible and near ultraviolet wavelengths.

It is a still further primary object of the invention to provide the combination of high photospeed at long wavelengths without deleterious interaction with the printed circuit board copper surfaces or circuitry, and without the introduction of heavy metals into the environment.

It is still another object of the invention to provide a positive photoresist system utilizing a chemically amplified, acid catalyzed deprotection reaction pathway.

It is a further object of the invention to provide a positive photoresist system that is compatible with step and repeat expose tools and direct write laser processes.

It is a further object of the invention to provide a positive photoresist system of low unexposed solubility and high solubility of exposed regions in aqueous alkaline solvents.

It is another object of the invention to provide a positive photoresist system characterized by high photospeed in the near ultraviolet to visible region, that is, high photospeed to 365, 436, 488, and 514 nanometer radiation, either directly or indirectly through a photosensitizer.

SUMMARY OF THE INVENTION

The deficiencies of the prior art are obviated by the methods and compositions of the invention. The positive photoresist compositions and methods disclosed herein are particularly useful for imaging in the near-ultraviolet to visible spectrum. The positive photoresist system is characterized by the combination of:
(1). a photolabile polymer having recurrent pendant groups, such as t-butyl carbonate groups or t-butyl ester groups, that undergoes efficient acidolysis such that the polymer is substantially insoluble in alkaline solutions prior to exposure, and highly soluble in alkaline aqueous media after exposure;
(2). an acid generator capable of forming a strong acid, and chosen from the group consisting of sulfonate esters derived from N-hydroxyamides, and N-hydroxyimides; and
(3). a photosensitizer which is operative in the range of 350 to 600 nanometers The photoresists of the invention are aqueous base developable, chemically amplified photoresists. Chemically amplified photoresists are effective at doses an order of magnitude lower then conventional photoresists, requiring a dose less than or equal to 50 millijoules/centimeter$^2$. Thus, the chemically amplified photoresist systems of the invention are particularly preferred for high throughput production systems, such as step and repeat projection or direct laser write. Aqueous base developable resist systems are non-swelling, and the developer is ecologically manageable.

DETAILED DESCRIPTION OF THE INVENTION

The positive photoresist compositions and methods disclosed herein are particularly useful for imaging in the near-ultraviolet to visible spectrum. The positive photoresist system is characterized by the combination of:
(1). a photolabile polymer having recurrent pendant groups, such as t-butyl carbonate groups or t-butyl ester groups, that undergoes efficient acidolysis such that the polymer is substantially insoluble in aqueous solutions prior to exposure, and highly soluble in alkaline aqueous media after exposure;
(2). an acid generator capable of forming a strong acid, and chosen from the group consisting of sulfonate esters derived from N-hydroxyamides, and N-hydroxyimides; and
(3). a photosensitizer which is operative in the range of 350 to 600 nanometers.

Exemplary acid generators are trifluoromethyl sulfonates (triflates). Triflates are especially desirable as acid generators in the visible to near ultraviolet because they can be photosensitized to high photospeeds at very long wavelengths, that is, to visible and near ultraviolet wavelengths. The combination of high photospeed at long wavelengths is accomplished without deleterious interaction with the printed circuit board copper surfaces or circuitry, and without the introduction of heavy metals into the environment.

A photolabile polymer is a polymer that, in combination with an acid generator and a photosensitizer, is chemically dissociable or dissociated by incident radiation to yield soluble products. The preferred polymers are polyvinyls containing recurrent pendant groups that undergo efficient acidolysis to produce products having higher polarity and solubility than the original polymer.

The preferred acid labile pendant groups are (1) tertiary butyl esters of carboxylic acids and (2) tertiary butyl carbonates of phenols, as well as trityl, benzyl, and benzhydrl modifications and derivatives thereof. Exemplary polymers are poly (p-tert-butoxycarbonyloxy-alpha-methylstyrene), poly (p-tert-butoxycarbonyloxystyrene), poly (tert-butyl p-vinylbenzoate), poly (tert-butyl p-isopropenylphenyloxyacetate), and poly (tert-butyl methacrylate), as well as copolymers and mixtures thereof such as poly (tert-butylmethacrylate -co- methacrylate -co- methacrylic acid).

While vinyl polymers are preferred, it is of course, to be understood that heterochain polymers, as condensation polymers, and addition polymers, having the required pendant groups may also be utilized.

The acid generator provides the free radical or ionic species to initiate the acid catalyzed deprotection or main chain scission of the polymer. According to the invention described herein the species that initiates the acid catalyzed deprotection of the polymer is a sulfonate. The trifluoromethyl sulfonate ion (triflate ion) is the product of a trifluoromethyl sulfonic acid (triflate) precursor that generates a strong acid upon exposure to near ultra-violet or visible radiation in the presence of a suitable photosensitizer.

The acid generator is chosen from the group consisting of non-ionic sulfonate esters derived from N-hydroxyamides, and N-hydroxyimides. These materials have the formula:

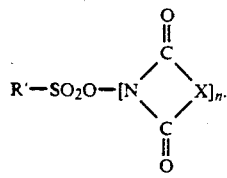

R' is an organic group chosen from the group consisting of aliphatic, cycloaliphatic, and aromatic groups. Preferably R is a $C_1$ to $C_{10}$ hydrocarbon group, a halogen substituted $C_1$ to $C_{10}$ hydrocarbon group, or a halogen substituted aromatic group. In a particularly preferred exemplification of the invention R' is —$CF_3$, and R'—$SO_2O$ is the triflate group $CF_3$—$_{SO2}O$—.

When R' is a halogen substituted $C_1$ to $C_{10}$ hydrocarbon group, it is preferably a fluoro-substituted hydrocarbon as $CF_3$, $C_2F_5$, $C_2F_2H$, $C_3F_5$, $C_4F_9$, $C_nF_{2n}H$, or $C_nF_{2n+1}$, where n is from 1 to 6, and preferably 1, and $C_6X_nH_{5-n}$, where n is from 1 to 6. Exemplary halogen substituted aromatic groups include $C_6H_4F$, $C_6H_4Cl$, and $C_6H_4Br$.

X is such that when combined with

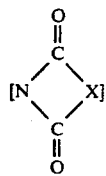

a five to seven membered ring is formed. This ring may contain one or more of N and O. In a particularly preferred exemplification the ring contains one nitrogen atom, and no oxygen atoms.

The preferred photoacid generators are aryl triflates and triazines. An especially preferred acid generator is N-(trifluoromethylsulfonoxy) phthalimide, also referred to as phthalimide triflate and as PDT, having the structural formula:

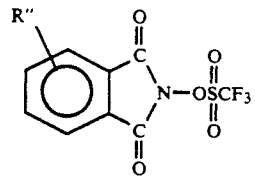

where R" is H, F, Cl, Br, $C_6H_5$, $OCH_3$, $C_nH_{2n+1}$, and $C_nH_{2n+1}$.

Other preferred photoacid generators are the aryl triflate, includings 6,7-bis (tri-fluoromethylsulonyloxy) courmarin having the formula:

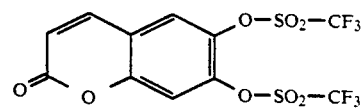

and 2,3,4-tris (trifluoromethylsulfonyloxy) benzophenone having the formula

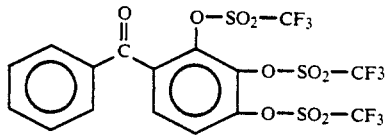

Still other preferred triflate acid generators include trifluoromethylsulfonyl oxybicyclo-[2,2,1]-hept-5-ene 2,3-dicarboximide (referred to as MDT), and 2,3-diphenyl maleimide triflate (DPMT). Other triflates useful in the method and near UV to visible light photoresist composition of the invention include ortho-disubstituted aryl bis-triflates as well as aryl tris-triflates where all of the triflate groups are adjacent, as in 2,3,4-tris triflates.

Photoacid generators are sensitized by substituted anthracenes which absorb and subsequently transfer an electron to the photoacid generator. This causes the formation of $CF_3$—$SO_3H$, which is a strong acid. This acid catalyzes the removal of protecting groups on the polymer.

Especially preferred photosensitizers are polyaromatic dyes. These include anthracene, 9-anthracene methanol, 1,4-dimethoxyanthracene, 9,10-diethylanthracene, 9-phenoxymethylanthracene, the 9,10-bis (ethynyl) anthracenes, and the 1,8,9,10-tetra substituted anthracenes. The 9,10-bis (ethynyl) anthracenes have the formula:

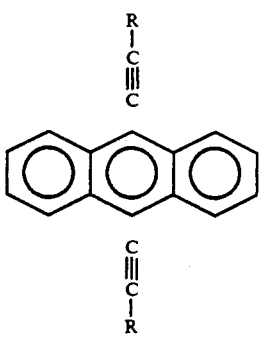

where R represents an aryl or alkyl group without N or NH functionality. Exemplary are trimethylsilyl- or n-butyl-functionality, as in 9,10-bis (trimethylsilylethynyl) anthracene and 9,10-bis (n-butylethynyl) anthracene. 9,10-bis (trimethylsilylethynyl) anthracene is particularly useful for 365 nanometer energy sources; 9,10-bis (n-butylethynyl) anthracene and 9,10-bis (trimethyl silylethynyl) anthracene are particularly useful for 405 and 436 nanometer energy sources; and 1,8- dimethoxy -9,10-(bisphenylethynyl) anthracene for 488 and 514 nanometer energy sources.

The positive photoresist composition may be prebaked, e.g., heated prior to exposure. The preheat, when carried out, is at a temperature of about 85 degrees Centigrade to about 95 degrees Centigrade, for about 1 minute to about 5 minutes.

The photoresist composition is then exposed to actinic radiation of a suitable wavelength, for example through a photomask or by direct laser writing, to generate a strong acid. The radiation may be near ultraviolet radiation, for example 350 to 450 nanometer radiation, or visible radiation, 450 to 600 nanometers.

In the case of near UV radiation, that is, 350 to 450 nanometers, a dose of about 10 milliJoules per square centimeter to about 100 milliJoules per square centimeter followed by a post-expose bake at about 75 degrees Centigrade to about 100 degrees Centigrade for about 90 seconds is sufficient to form a latent image in the resist film. In the case of visible light exposure at wave lengths of 450 to 550 nanometers, for example, of printed circuit boards, a dose of from about 10 to about 50 milliJoules/cm$^2$, followed by a post-bake at 80 degrees Centigrade to 110 degrees Centigrade for about 5 to 20 minutes is sufficient to form a developable image in the resist.

After post-baking the exposed photoresist is developed, that is, contacted with an aqueous alkali media, as an ammonium salt of a weak acid, or a sodium or potassium salt of weak acid. Preferred developers include aqueous tetramethyl ammonium hydroxide (TMAH) (0.18N to 0.27N), potassium hydoxide, sodium hydroxide, sodium carbonate, or sodium metasilicate.

Development time for silicon wafers with a spin coated positive photoresist having a thickness of about 0.8 micron to about 2 microns, is typically on the order of about 15 to 120 seconds at temperatures of about 20 degrees Centigrade to about 25 degrees Centigrade. For silicon wafer lithography as described, a feature size of from about 0.5 micron to 10 microns can be photolithographically defined. For printed circuit board processing, with coatings of from about 2 to about 25 microns thick, development time is typically about 100 seconds to about 300 seconds at a temperature of about 25 degrees Centigrade to about 40 degrees Centigrade. For printed circuit board lithography as described, a feature size of 10 to 200 microns can be photolithographically defined.

Thus, according to the invention there is provided a positive photoresist system utilizing a chemically amplified, acid catalyzed deprotection reaction pathway, that is compatible with step and repeat expose tools and direct write processes. The positive photoresist system has high photosensitivity, resulting in high throughput compared to diazonaphthaquinone/Novalak systems, and is aqueous developable. This overcomes noted deficiencies of the prior art. Moreover, the photoresist can be rendered sensitive to any wavelengths in the 350 to 600 nanometer wavelength region by using appropriate sensitizing dyes.

EXAMPLES

The methods and compositions of the invention may be understood by reference to the following examples.

Procedure

In each example, a resist formulation of (1) a non-metallic acid generator such as (MDT), phthalimide triflate (PDT), or 2,3-diphenyl maleimide triflate (DPMT), (2) a photosensitizer, and (3) a photolabile polymer in propylene glycol methyl ether acetate was prepared. This resist formulation was then coated onto a substrate, e.g., spin coated onto a silicon wafer or coated onto a copper panel, to give a uniform thin film of resist. The coated substrate was then heated to pre-bake the resist. The pre-baked resist was then exposed at a wavelength between 350 and 600 nanometers with a dose of 10-100 milliJoules per square centimeter, and thereafter subjected to a post expose bake to form a latent image. The latent image was then developed with an aqueous alkaline developer, which was either spray or immersion.

Example 1

A ten gram photoresist composition was prepared containing 2 weight percent (MDT), 20 weight percent polyvinylphenol-co-t-butoxycarbonyloxystyrene, 2.5 weight percent of 9-anthracene methanol in a propylene glycol methyl ether acetate solution. The resist was applied to a silicon wafer and spin coated to yield a 0.9 micron film. After a 1 minute bake at 90 degrees Centigrade on a hot plate, the film was exposed on an i-line (365 nanometer) stepper (NA=0.35) with a dose of about 30-50 milliJoules per square centimeter, and thereafter subjected to a post expose bake at 90 degrees Centigrade for 90 seconds to form a latent image. The latent image was spray developed in 0.24 Normal tetramethylammonium hydroxide for 45 seconds. A pattern was obtained of 0.9 micron spaces and 1.6 micron resist islands.

Example 2

A ten gram photoresist composition was prepared containing 2 weight percent MDT, 20 weight percent polyvinylphenol-co-t-butoxccarbonyloxstyrene, and 1.0 weight percent 9,10-bis(trimethylsilylethynyl) anthracene in a propylene glycol methyl ether acetate solution. The resist was applied to a silicon wafer and spin coated to yield a 0.9 micron film. After a 1 minute bake at 90 degrees Centigrade on a hot plate, the film was exposed with a mercury vapor lamp through a 436 nanometer bandpass filter and mask with a dose between 20 -50 milliJoules per square centimeter, and thereafter subjected to a post expose bake at 90 degrees Centigrade for 90 seconds to form a latent image. The latent image was immersion developed in 0.24 Normal tetramethylammonium hydroxide for 60 seconds to obtain a pattern of lines and spaces.

Example 3

A photoresist composition was prepared containing 20 weight percent of a methylmethacrylate/methacrylic acid/t-butyl methacrylate terpolymer in a propylene glycol methyl ether acetate solution containing 10 parts per hundred (basis resist polymer) phthalimide triflate (PDT), and 3 parts per hundred (basis resist polymer) of 1,8-dimethoxy-9,10-bis(phenylethynyl) anthracene. Ten microns of the resist was applied to a copper panel, and pre-exposure baked at 90 degrees Centigrade for 3 minutes. The panel was exposed at 488-514 nanometers at a dose of 15 milliJoules per square centimeter, and thereafter subjected to a post expose bake at 105 degrees Centigrade for 20 minutes to form a latent image. The latent image was spray developed in 1.2 percent aqueous sodium carbonate for 75 seconds. A pattern of spaces and lines was obtained.

Example 4

A ten gram photoresist composition was prepared containing 2 weight percent 2-3-4-tris (trifluoromethylsulfonyloxy) benzophenone, 20 weight percent polyvinylphenol-co-t-butoxycarbonyloxystyrene, 2.5 weight percent of 9,10-bis (n-butylethynyl) anthracene in a propylene glycol methyl ether acetate solution. The resist was applied to a silicon wafer and spin coated to yield a 0.9 micron film. After a 1 minute bake at 90 degrees Centigrade on a hot plate, the film was exposed with a mercury vapor lamp through a 436 nanometer bandpass filter a dose between 20-50 milliJoules per square centimeter, and thereafter subjected to a post expose bake at 90 degrees Centigrade for 90 seconds to form a latent image. The latent image was spray developed in 0.24 Normal tetramethylammonium hydroxide for 60 seconds to obtain a pattern of lines and spaces.

Example 5

A series of tests were carried out to compare the photolytic effects of an onium triphenylsulfonium SbF$_6$ salt to phthalimide triflate (PDT) as an acid generator. In all of the tests a photoresist composition of 2 weight percent of the acid generator, 20 weight percent polyvinylphenol-co-t-butoxycarbonyloxstyrene, and anthracene methanol in a propylene glycol methyl ether acetate solution was prepared. The dose of 365 nanometer light to clear the resist is shown in Table 1, below.

TABLE 1

| Dose of UV Light to Clear Resist As A Function Of Initiator | | | |
|---|---|---|---|
| Parts Photoacid Generator | Parts Sensitizer | Sensitizer PDT | Onium |
| 10 | 2 | <0.5 mJ | 9 mJ |
| 5 | 1 | <1.0 mJ | — |
| 2.5 | 0.5 | 5.0 mJ | — |

Example 6

A series of tests were carried out to compare the photolytic effects of a the sensitizer on the 365 nanometer dose to clear a positive photoresist. Three of the photoresist compositions contained 2 weight percent MDT and the fourth photoresist composition contained 2,3-diphenyl maleimide triflate (DPMT) as the photoinitiator. In all of the tests a photoresist composition of 2 weight percent of the acid generator, 20 weight percent polyvinylphenol-co-t-butoxycarbonyloxstyrene, and 2.5 weight percent photosensitizer in a propylene glycol methyl ether acetate solution was prepared. The dose of 365 nanometer light through a 365 nanometer bandpass filter on an ORIEL exposure tool to clear the resist is shown in Table 2, below.

TABLE 2

| Dose of UV Light To Clear Polymer As a Function of Photosensitizer | |
|---|---|
| Sensitizer | Dose |
| DPMT Acid Generator + 9-phenoxymethylanthracene | 1 mJ |
| MDT Acid Generator + 9-anthracene methanol | 14 mJ |
| MDT Acid Generator + 1,4-dimethoxyanthracene | 9 mJ |
| MDT Acid Generator + 9,10-dimethylanthracene | 3 mJ |

While the invention has been described with respect to certain preferred embodiments and exemplifications, it is not intended to limit the scope of the invention thereby, but solely by the claims appended hereto.

We claim:

1. A positive photoresist capable of forming a latent image upon exposure to about 10 to 100 millijoules per square centimeter of radiation having a wave length of about 350 to 450 nanometers, said photoresist consisting essentially of:

(1). a substantially water and base insoluble, photolabile polymer having recurrent pendant groups that undergo efficient acidolysis to produce products having higher polarity and solubility than the original polymer;

(2). an acid generator capable of forming a strong acid, and chosen from the group consisting of sulfonate esters of N-hydroxyamides and N-hydroxyimides; and (3). 9,10 bis(trimethylsilyl ethynyl) anthracene photosensitizer having the structure

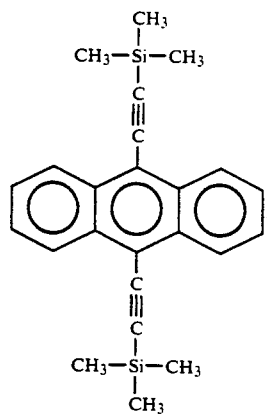

2. A positive photoresist capable of forming a latent image upon exposure to about 10 to 100 millijoules per square centimeter of radiation having a wave length of about 350 to 450 nanometers, said photoresist comprising:

(1). a substantially water and base insoluble, photolabile polymer having recurrent pendant groups chosen from the group consisting of (1) tertiary butyl esters of carboxylic acids, (2) tertiary butyl carbonates of phenols, and (3) trityl, benzyl, and benzhydryl modifications and derivatives thereof that undergo efficient acidolysis to produce products having higher polarity and solubility than the original polymer;

(2). an acid generator capable of forming a strong acid, and chosen from the group consisting of sulfonate esters derived from N-hydroxyamides and N-hydroxyimides, and having the formula

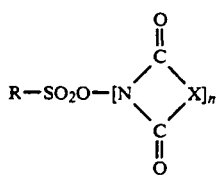

where R is an organic group chosen from the group consisting of $C_nF_{2n}H$, $C_nF_{2n+1}$, $C_6H_4F$, $C_6H_4Cl$, and $C_6H_4Br$, where n is a number from 1 to 6, and X represents aromatic functionality; and (3). 9,10 bis(trimethylsilyl ethynyl) anthracene photosensitizer having the structure

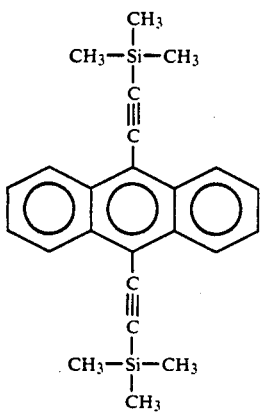

said photosensitizer absorbing incident radiation at 436 nanometers.

3. A positive photoresist capable of forming a latent image upon exposure to about 10 to 100 millijoules per square centimeter of radiation having a wave length of about 350 to 450 nanometers, said photoresist comprising:

(1). a substantially water and base insoluble, photolabile polymer having recurrent pendant groups chosen from the group consisting of (1) tertiary butyl esters of carboxylic acids, (2) tertiary butyl carbonates of phenols, and (3) trityl, benzyl, and benzhydryl modifications and derivatives thereof, chosen from the group consisting of chosen from the group consisting of poly(p-tert-butoxycarbonyloxy-alpha-methylstyrene), poly(p-tert-butoxycarbonyloxystyrene), poly(tert-butyl p-vinylbenzoate), poly(tert-butyl p-isopropenylphenyloxyacetate), poly(tert-butyl methacrylate), poly(tert-butylmethacrylate-co-methacrylate-co-methacrylic acid) and other copolymers and mixtures thereof, the polymer being capable of undergoing efficient acidolysis to produce products having higher polarity and solubility than the original polymer;

(2)an acid generator capable of forming a strong acid, and chosen from the group consisting of n-(trifluoromethylsulfonoxy) sulfonate esters derived from N-hydroxyamides and N-hydroxyimides, and having the formula

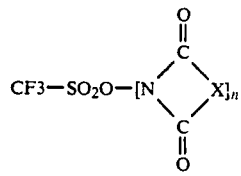

wherein X represents aromatic functionality; and (3). 9,10 bis(trimethylsilyl ethynyl) anthracene photosensitizer having the structure

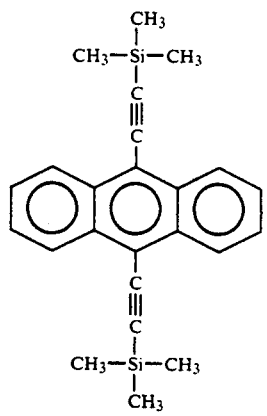

said photosensitizer absorbing incident radiation at 436 nanometers.

* * * * *